United States Patent [19]
Nicollini et al.

[11] Patent Number: 5,136,258
[45] Date of Patent: Aug. 4, 1992

[54] CIRCUIT ARRANGEMENT FOR ENHANCING THE TRANSCONDUCTANCE OF A DIFFERENTIAL AMPLIFIER STAGE COMPRISING MOS TRANSISTORS

[75] Inventors: Germano Nicollini, Piacenza; Rinaldo Castello, Arcore-Milano, both of Italy

[73] Assignee: SGS-Thomson Microelectronics S.r.l., Milan, Italy

[21] Appl. No.: 768,457

[22] Filed: Sep. 30, 1991

Related U.S. Application Data

[63] Continuation of Ser. No. 515,925, Apr. 27, 1990, abandoned.

[30] Foreign Application Priority Data

Apr. 28, 1989 [IT] Italy ................ 20317 A/89

[51] Int. Cl.[5] .............................................. H03F 3/45
[52] U.S. Cl. ................................................... 330/253
[58] Field of Search ................................. 330/252, 253

[56] References Cited

U.S. PATENT DOCUMENTS 3,678,404  7/1972  Blom .................. 330/252 X
4,697,112  9/1987  Ohtani ................. 307/530
4,720,685  1/1988  Garuts ................. 330/149

FOREIGN PATENT DOCUMENTS 2619972  3/1989  France ................. 330/252
8903612  4/1989  World Int. Prop. O. .

OTHER PUBLICATIONS

Journal of the Audio Engineering Society, vol. 29, No. 7/8, N.Y., U.S.A. pp. 503-510; M. J. Hawksford "Distortion Correction Circuits for Audio Amplifiers".

Primary Examiner—James B. Mullins
Attorney, Agent, or Firm—Sughrue, Mion, Zinn, Macpeak & Seas

[57] ABSTRACT

A circuit arrangement for enhancing the transconductance of a differential amplifier stage comprising a pair of MOS transistors, having respective source electrodes connected together through a circuit node, comprises a pair of active components respectively connected in each of the connections between the aforesaid electrodes and the aforesaid node and serving a characteristic function corresponding to that of a negative value resistor. This arrangement enables the transconductance of the differential stage to be increased while keeping the dissipated electric power low and the area occupied in an integrated circuit small.

6 Claims, 3 Drawing Sheets

CIRCUIT ARRANGEMENT FOR ENHANCING THE TRANSCONDUCTANCE OF A DIFFERENTIAL AMPLIFIER STAGE COMPRISING MOS TRANSISTORS

This is a Continuation of Application Ser. No. 07/515,925 filed Apr. 27, 1990.

BACKGROUND OF THE INVENTION

This invention relates to a circuit arrangement for enhancing the transconductance of a differential amplifier stage comprising a pair of MOS transistors, having respective source electrodes connected together through a circuit node.

As is well known, the differential stage or cell is one of the most widely used circuit components to be employed in a comprehensive range of analog circuit designs.

The structure of a bipolar technology differential stage comprises a pair of transistors which are connected together by way of their respective emitters through a circuit node which is also connected to a negative supply pole via a bias current source.

Also known are differential stages using the MOS technology, that is comprising a pair of field-effect transistors of the MOS type which have respective source electrodes connected together through the aforesaid circuit node.

Structures of the above-mentioned kind are described, for instance, in the publication: "Analysis and Design of Analog Integrated Circuits", Wiley & Sons, 1986.

It is a recognized fact that the electric signal input to a differential stage is represented by a voltage value Vin equal to the difference of the voltage values applied to the respective bases of the transistor pair, or to the respective gates of the MOS transistor pair.

The output electric signal is represented instead by a current Iout given by the difference between the values of the currents flowing through the respective collectors of the bipolar transistor pair, or the respective drains of the MOS transistor pair.

SUMMARY OF THE INVENTION

The basic parameter in defining the performance of a differential stage is represented by the so-called transconductance (gm), i.e. the ratio of the change in the output current to a change in the input voltage. This parameter shows to be dependent of the operating point whereat the stage is driven (biased) to cut in.

The transconductance of a MOS transistor differential stage is, for given current supply and transistor dimensions, much lower than that of a differential stage with bipolar transistors.

In other words, in order to have the same transconductance from both of these different technologies, the MOS transistors should have large dimensions and a high current flown therethrough.

Accordingly, in all those fields of application where high transconductance differential stages must be provided in the MOS technology, it becomes necessary to employ MOS transistors of huge dimensions and having very high currents flown therethrough. Consequently, serious problems are brought about by the broad area occupied by such differential stages in the integrated circuits to which they are incorporated, as well as by the electric power dissipated thereby in large amounts.

The shortcomings that accompany MOS technology differential stages have long been known, but the prior art has failed heretofore to provide any effective solutions to such problems.

The technical problem that underlies this invention is to provide a circuit arrangement which has such design and performance characteristics as to enhance the transconductance of a differential stage comprising MOS transistors, and at the same time keep the power dissipated by such stages low while occupying a reduced integrated circuit area.

The solutive idea on which the invention is based is one of providing the differential stage with an active circuit connected between the source electrodes of the MOS transistors and acting as a pair of negative value resistors.

On the basis of the above solutive idea, the technical problem is solved by a circuit arrangement as indicated being characterized in that it comprises a pair of active components respectively connected in each of the connections between said electrodes and said node to perform a function which corresponds characteristically to that of a negative value resistor.

In a preferred embodiment, said active components are comprised of a second pair of MOS-type transistors having respective drain electrodes connected to corresponding source electrodes of the transistors in said first pair as well as to the gate electrode of the other transistor.

The features and advantages of the circuit arrangement according to the invention will be apparent from the following detailed description of an embodiment form thereof, to be taken by way of illustration and not of limitation in conjunction with the accompanying drawings.

DESCRIPTION OF THE PREFERRED EMBODIMENT

Figure 1:
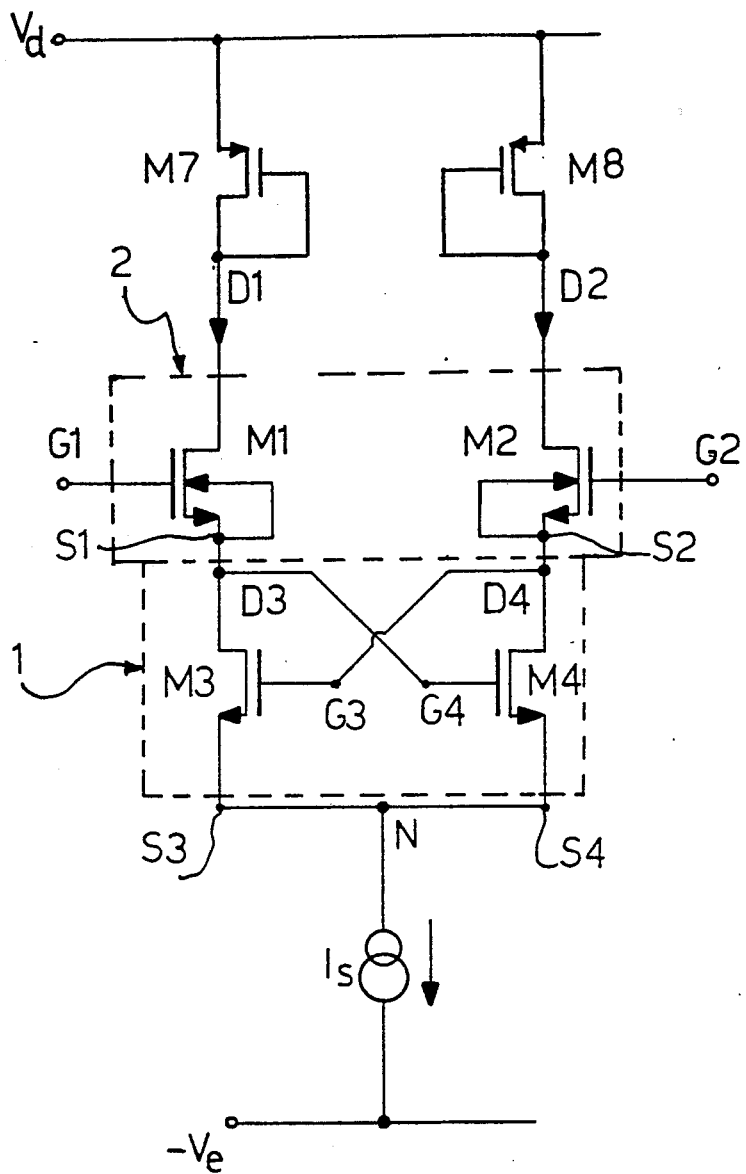
FIG. 1 is a diagrammatic representation of a differential stage incorporating the circuit arrangement of this invention.

With reference to the drawing views, generally and schematically shown at 1 is a circuit arrangement for enhancing the transconductance of a differential amplifier stage 2 comprising a pair of enhancement n-channel MOS-type transistors M1 and M2.

These transistors M1 and M2 have respective source electrodes S1 and S2 substantially interconnected through the circuit arrangement 1, while being led to a circuit node indicated at N.

This node N is connected to a negative voltage supply pole -Ve via a bias current source or generator Is.

The drain electrodes D1 and D2 of the transistor pair M1, M2 are respectively connected to a voltage supply pole Vd via MOS transistors M7 and M8, each connected in a diode configuration.

Advantageously, in accordance with the invention, the arrangement 1 comprises a pair of active components M3 and M4, each formed by a MOS-type transistor.

Each active component is connected in the electric connection between every source electrode S1 and S2 and the node N. More specifically, the transistor M3 has its drain electrode D3 connected to the source electrode S1 of the transistor M1, whilst the second transistor M4 has its corresponding drain electrode D4 connected to the source electrode S2 of the other transistor M2 in the stage 2.

The respective source electrodes S3 and S4 of that second transistor pair M3, M4 are interconnected via the node N.

In addition, each of the transistors M3 and M4 has its corresponding gate electrode G3 and G4 cross-connected to the other transistor forming the pair.

Figure 2:
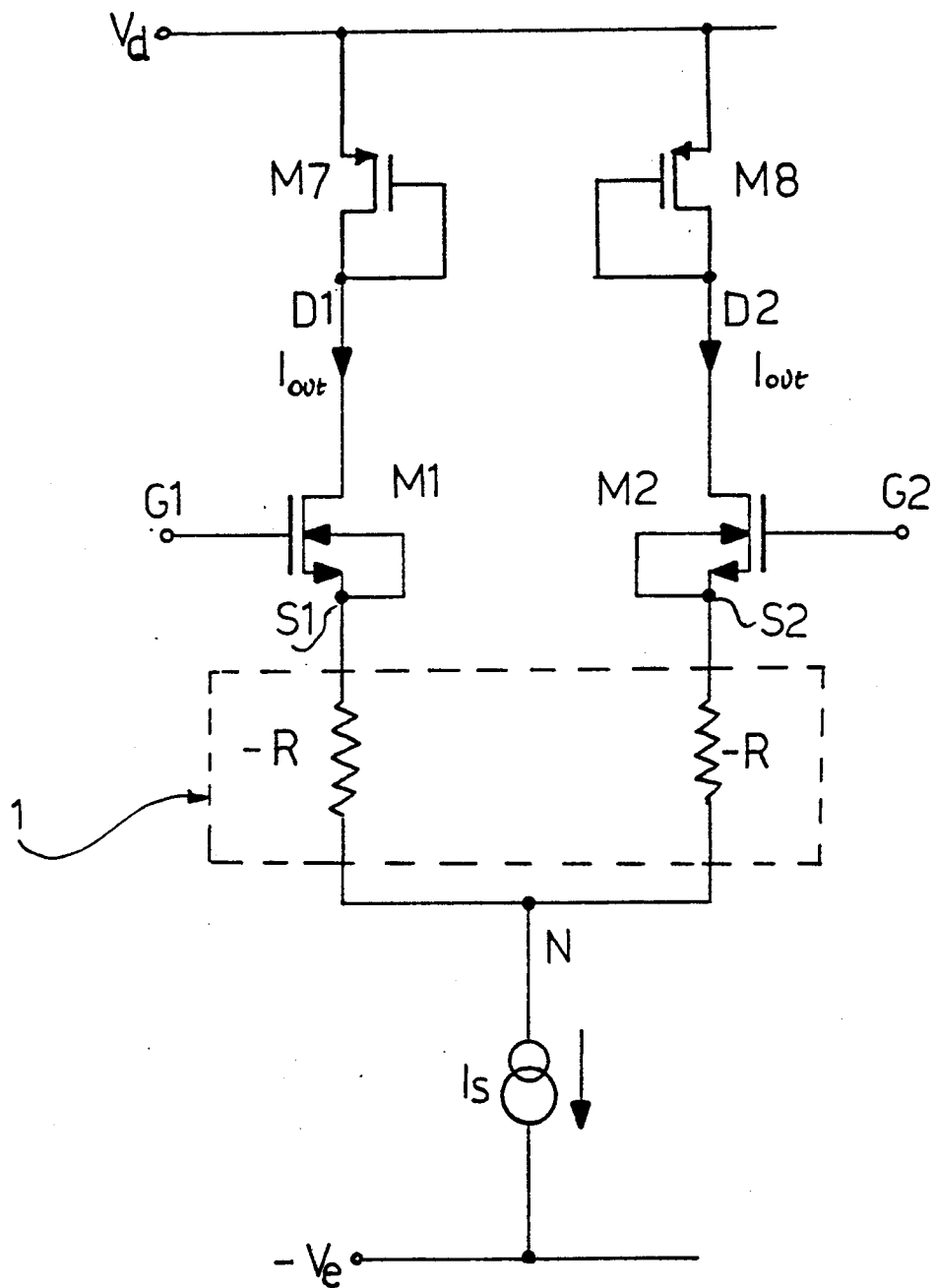
FIG. 2 is the equivalent wiring diagram of the differential stage shown in FIG. 1.

The active components M3 and M4 serve a characteristic function corresponding to that of a negative value resistor. In this respect, shown in FIG. 2 is an equivalent electric wiring diagram of the inventive differential stage shown in FIG. 1.

In that diagram, the active components M3 and M4 have been represented schematically with a negative value resistor R.

The value of the current Iout output by the differential stage 2 is given by the following relation, $$Iout = gm1 * Vin/(1 - gm1 * R)$$

where, gm1 is the transconductance of the differential pair formed by transistors M1 and M2, R is the value of the equivalent resistance of each of the active components M3 and M4, and Vin is the value of the input voltage.

The resistance value R being negative, it follows that the circuit arrangement of this invention can greatly increase the value of the equivalent transconductance of the differential stage to which it has been incorporated.

More particularly, by applying the so-called low-signal method of analysis, it becomes possible to calculate the resistance, or rather, the DC impedance, of the inventive circuit arrangement, as seen from the source electrodes S1 and S2.

It may be shown that the value of that resistance R is equal to $-1/gm3$, where gm3 is the transconductance of transistor M3.

By substituting this resistive value in the previously specified relation, it may be shown that the amplification factor of the transconductance gm1 of differential stage 2 is tied to the ratio gm3/gm1. The value of this ratio can be selected with special accuracy in current production integrated circuits, and in this particular case, is set at 0.9.

The last-mentioned value has proved specially effective to provide a significant increase in the transconductance of differential stage 2, while avoiding triggering of objectionable oscillations in the circuit arrangement 1, which due to the cross-connected transistors M3 and M4, forms essentially a positive feedback loop for which a lower loop gain than unity must be ensured.

For the sake of completeness, it should be further noted that, in a preferred embodiment form, the transistors M1, M2 and M3, M4 are the same length L, have a width W which is proportional among them by a constant K1, and have equal currents flown therethrough because the gate currents of M3 and M4 are null.

In this way, it becomes possible to define in a specially accurate and industrially reproducible manner the value of the ratio gm3/gm1 to determine the transconductance element of the differential stage.

Figure 3:
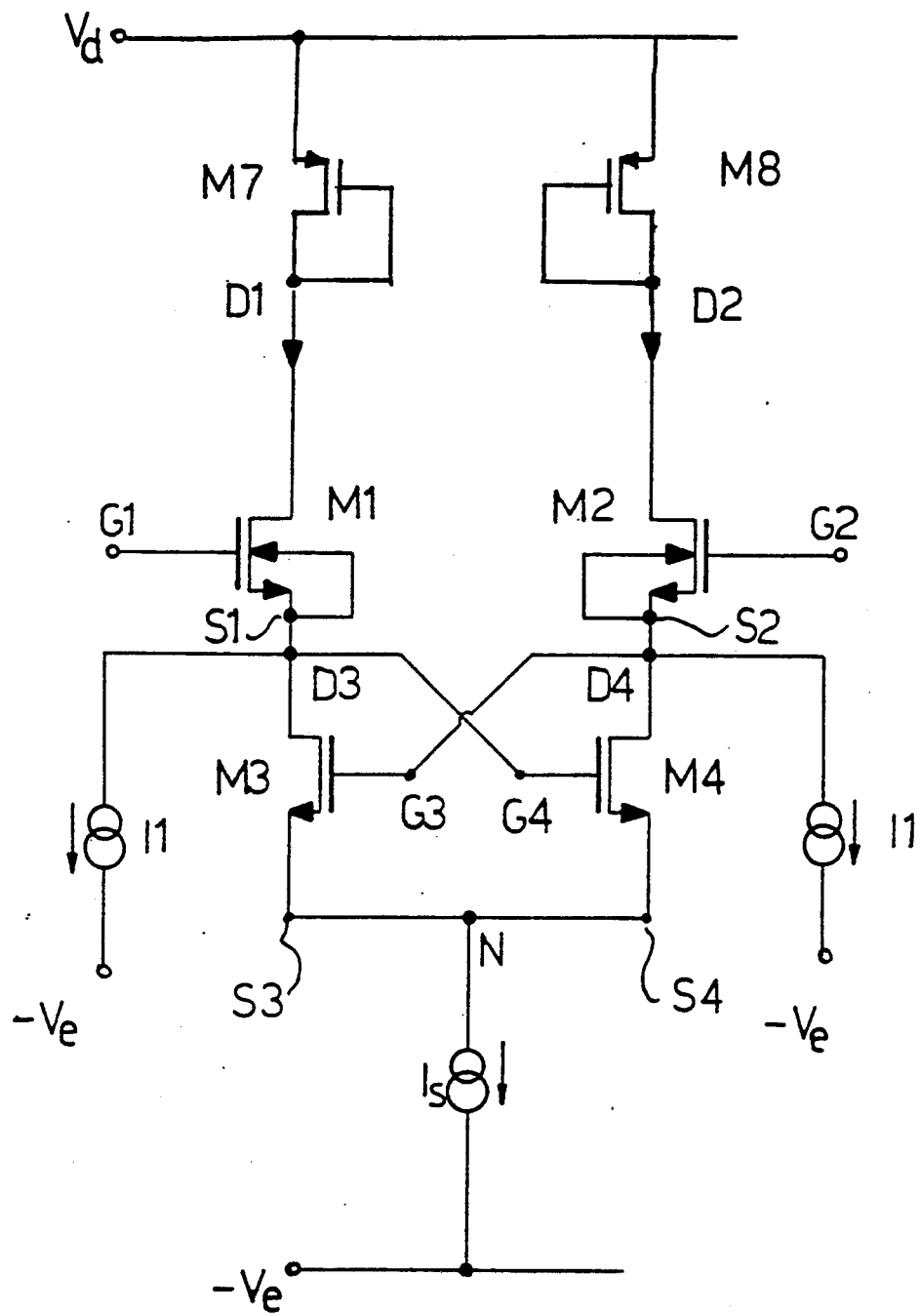
FIG. 3 shows a wiring diagram for a modified embodiment of the circuit arrangement in FIG. 1.

With particular reference to the example shown in FIG. 3, a modified embodiment of the circuit arrangement according to the invention will be now described, wherein cooperating items and parts being similar in structure and operation to those of the previously-described embodiment are denoted by the same reference numerals and characters.

In FIG. 3, the circuit arrangement 1 is shown to include a pair of identical current sources or generators I1. A first current source I1 has one end connected to the source electrode S1 of transistor M1 in the stage 2, and the other end connected to the supply pole -Ve.

Likewise, the second current source I1 has one end connected to the source electrode S2 of the second transistor M2 in the stage 2, and the other end connected to the aforesaid pole.

In this variant, the geometrical length L and width W dimensions of all the transistors M1, M2, M3 and M4 are the same among them, whilst the value of the current I1 generated by the aforesaid sources or generators is given by the following relation, $$I1 = (K3 - 1) * Is$$

where, K3 is a constant.

The operation of the circuit arrangement according to this variant of the invention is basically the same as that of the previously described embodiment.

The circuit arrangement of this invention can be readily incorporated, using conventional techniques, to an integrated circuit also incorporating the differential stage of MOS transistors.

By in turn implementing the inventive circuit arrangement with the MOS technology, a circuit can be obtained which is specially compact and has low electric power requirements.

This circuit arrangement solves, therefore, the technical problem by affording greatly increased transconductance of a differential stage including MOS transistors, while drawing a modest amount of electric power and occupying an unusually small area of the integrated circuit.

We claim:

1. A circuit arrangement for enhancing the transconductance of a differential amplifier stage comprising:
   a pair of MOS-type transistors (M1, M2) having respective source electrodes connected together through a circuit node;
   a pair of active components (M3, M4), each connected in a respective connection between said electrodes and said node such that each of said active components characteristically corresponds to a negative value resistor; and
   a pair of identical current sources (I1, I1), each having one end connected to a corresponding source electrode of said transistor pair.

2. The circuit arrangement according to claim 1, wherein said transistors and said active components are the same length, have a width which is proportional among them by a constant, and have bias currents between the drain and the source flow respectively therethrough which are the same value.

3. The circuit arrangement according to claim 1, wherein each of said pair of MOS transistors has a drain electrode connected to a supply pole through respective MOS transistors (M7, M8), each of said respective MOS transistors being connected in a diode configuration.

4. The circuit arrangement according to claim 1, wherein each of said active components is a MOS-type transistor.

5. The circuit arrangement according to claim 4, wherein said active components are cross-connected together, and wherein drain electrodes of said active components are connected to respective source electrodes of said pair of MOS-type transistors.

6. The circuit arrangement according to claim 1, wherein a value of the negative value resistor is an inverse of a transconductance of one of said active components.

* * * * *